United States Patent [19]

Slepcevic

[11] 4,332,537
[45] Jun. 1, 1982

[54] ENCAPSULATION MOLD WITH REMOVABLE CAVITY PLATES

[76] Inventor: Dusan Slepcevic, 1240A Mountain View-Alviso Rd., Sunnyvale, Calif. 94086

[21] Appl. No.: 925,295

[22] Filed: Jul. 17, 1978

[51] Int. Cl.³ .......................... B29C 1/00; B29D 3/00; B29D 31/00
[52] U.S. Cl. ..................................... 425/121; 249/83; 249/95; 249/110; 425/126 R; 425/127; 425/128; 425/129 R; 425/438; 425/444; 425/556; 425/572; 425/588
[58] Field of Search ............... 425/110, 117, 123, 127, 425/129 R, 444, 438, 801, 554, 572, 588, 556; 264/278, 277, DIG. 34, 272, 297, 269, 157; 249/66 A, 66 R, 67, 105, 110, 84, 85, 160

[56] References Cited

U.S. PATENT DOCUMENTS

| | | | |
|---|---|---|---|
| 2,382,200 | 8/1945 | Brunner | 425/123 |
| 2,596,993 | 5/1952 | Gookin | 249/110 |
| 2,672,653 | 3/1954 | Simkins et al. | 249/110 |
| 3,467,986 | 9/1969 | Canty et al. | 425/129 |
| 3,539,675 | 11/1970 | Hugill | 264/157 |
| 3,571,920 | 3/1971 | Berg | 264/272 |
| 3,574,815 | 4/1971 | Segerson | 264/269 |
| 3,650,648 | 3/1972 | Lambrecht | 425/129 |
| 3,753,634 | 8/1973 | Bliven et al. | 425/123 |
| 3,779,506 | 12/1973 | Adams | 249/110 |
| 3,849,383 | 11/1974 | Fletscher et al. | 264/272 |
| 3,981,074 | 9/1976 | Yamamoto et al. | 264/272 |
| 4,003,544 | 1/1977 | Bliven et al. | 425/121 |
| 4,044,984 | 8/1977 | Shimizu et al. | 425/116 |
| 4,126,292 | 11/1978 | Saeki et al. | 249/110 |

FOREIGN PATENT DOCUMENTS

| | | |
|---|---|---|
| 1604640 | 12/1970 | Fed. Rep. of Germany . |
| 1665921 | 2/1971 | Fed. Rep. of Germany . |
| 1943210 | 3/1971 | Fed. Rep. of Germany . |
| 2819287 | 11/1978 | Fed. Rep. of Germany . |
| 1105207 | 3/1968 | United Kingdom . |
| 1194452 | 6/1970 | United Kingdom . |

Primary Examiner—W. E. Hoag
Attorney, Agent, or Firm—Phillips, Moore, Lempio & Majestic

[57] ABSTRACT

A cavity plate means is removably positioned between upper and lower mold plates with the upper surface of the cavity plate means flush against the upper mold plate. The cavity plate means has openings from top to bottom thereof and holds objects spaced from the upper mold plate with the portions of the objects which are to be encapsulated being in registration with the cavity plate openings. Fluid plastic is forced laterally through feed runners formed in the surface of the upper mold plate and downwardly through gates into the cavity plate openings. After the plastic has hardened, the plastic ejected from the feed runners of the upper mold plate and the cavity plate means is removed. Preferably the objects are pre-mounted on the cavity plate means, and the lower cavity plate surface is positioned flush against the lower mold plate which is uninterruptedly flat. Alternatively, the cavity plate means holds the objects against the lower mold plate which has cavities in registration with the openings through the cavity plate means.

30 Claims, 9 Drawing Figures

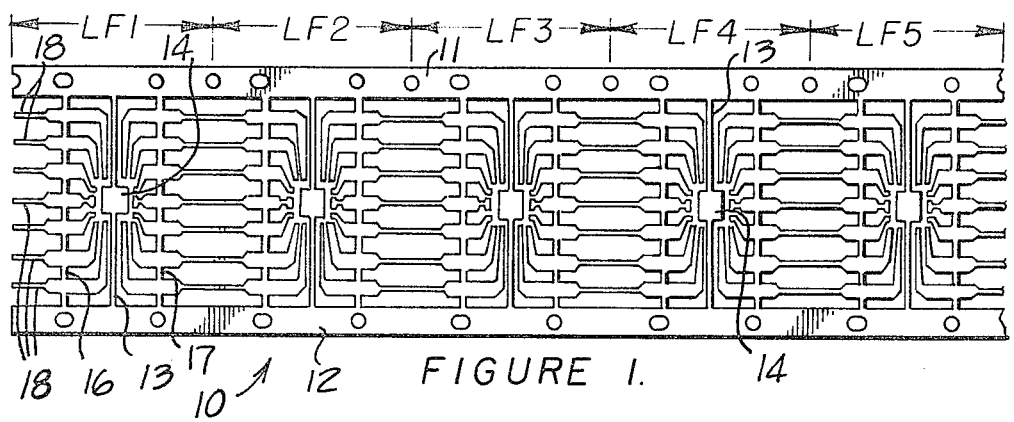
FIGURE 1.
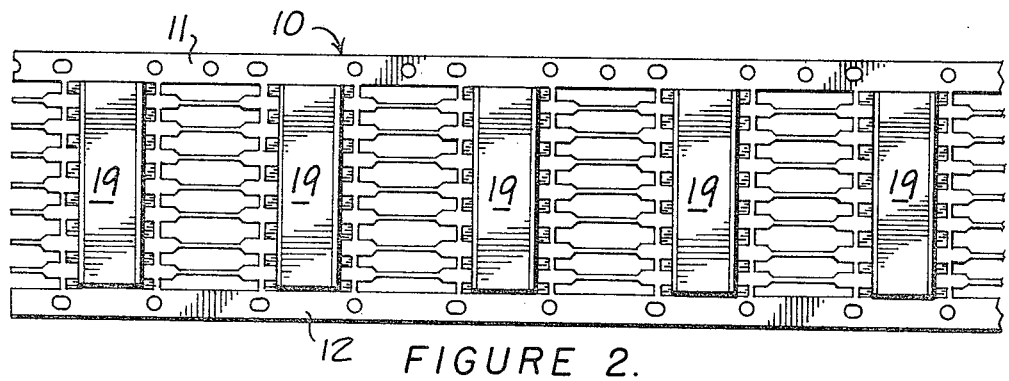
FIGURE 2.
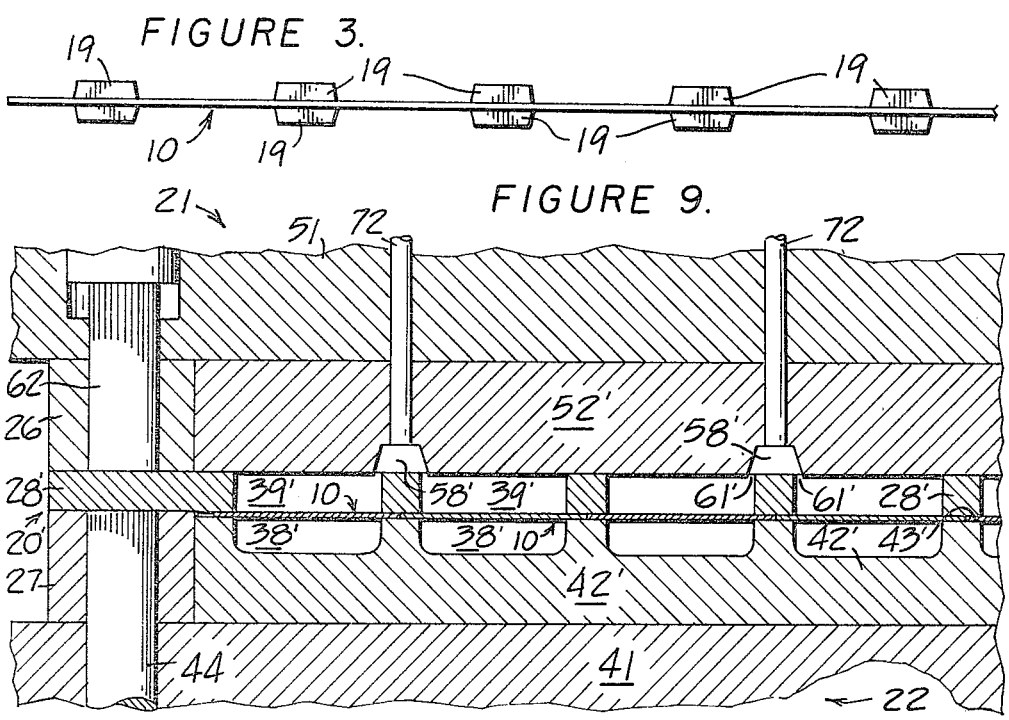
FIGURE 3.
FIGURE 9.

ENCAPSULATION MOLD WITH REMOVABLE CAVITY PLATES

BACKGROUND OF THE INVENTION

This invention relates to molds for plastic encapsulation of portions of objects.

Although not limited thereto, the present invention has particular suitability to the encapsulation of electronic components. For example, in the manufacture of semiconductor devices, it is common practice to provide lead frames in strip form, the strip having chip support pads spaced along the length thereof and leads extending lengthwise of the strip from adjacent each pad. A semiconductor chip is then supported on each pad and electrical connections are made from the various leads to each chip. After this has been done, the strip is then placed in a mold having a cavity for each chip and a suitable plastic encapsulating material is then forced into the mold to encapsulate each chip, a portion of the leads therefrom and the electrical connections of the leads to the chip.

Typical molds now in use will accommodate eight lead frame strips, each having ten lead frames thereon, so that 80 semiconductor devices may be encapsulated at one shot. Other molds can handle twelve strips of ten lead frames each for simultaneous encapsulation of 120 devices.

Regardless of the particular number of devices to be encapsulated at a time, the typical present mold comprises an upper and lower mold member. With the upper mold member raised, the various lead frame strips are positioned on the lower mold member such that the portions to be encapsulated are in registration with the mold cavities formed in the lower mold member, there being, of course, one cavity for each of the strip portions. The upper mold member which also has a complementary cavity formed thereinto for each strip portion is then lowered onto the lower mold member.

The mold is further provided with a main injection opening through one of the mold members which communicates with relatively large feed runners that extend along the lengths of the strips, with relatively small gate runners which branch off of the feed runners and extend to each cavity. A suitable plastic, in liquid form, is then injected through the main opening, to fill the feed runners, gates and mold cavities.

After the plastic has hardened, the mold members are separated and the strips, with the encapsulated portions thereon, are removed from the mold. To prevent damage to the devices as the mold members are separated, ejection pins are provided on at least one of the mold members to engage the encapsulated devices and force them out of the mold cavities thereof during mold separation.

The molding process is then repeated with a new batch of lead frame strips.

Although the present molds provide an effective encapsulation, they have a number of definite disadvantages. A substantial amount of down time exists. Each time a mold is used, the cavities, runners and gates must be checked and cleaned out, since a clogged runner or gate or a partially filled cavity will prevent the next molding operation from being carried out successfully. Time is also required to position each batch of lead frame strips in the mold prior to molding and to remove them from the cavities after molding. Additionally, it is customary to shut down for about an hour each day for a thorough cleaning of the molds.

The mold members are expensive, and require a considerable amount of precision machining to form the many cavities and the plastic distribution runners. Likewise, because of the many cavities and runners, they are difficult to clean and are relatively easy to damage during usual mechanical cleaning thereof.

Typically, the plastic which is used hardens upon the polymerization thereof. As a consequence, the injected plastic which fills the distribution system and hardens therein is pure wastage—it cannot be reused. Because of the extensive distribution systems of present molds, the ratio of plastic in the distribution system to the plastic actually used for encapsulation is high and the wastage of the relatively expensive plastic material is substantial.

Present molds are also expensive because of the ejection pin systems. Typically, two ejection pins are provided for each device to eject it from the cavity in which it is formed. Thus, for a 120 cavity mold, 240 ejection pins are required. Further, the pins will cause surface deformation of the plastic where the pins engage the devices, detracting from the appearance of the finished product as well as providing less room on the surface thereof for application of legending or other indicia thereto.

SUMMARY OF THE INVENTION

The present invention is directed towards overcoming one or more of the above disadvantages.

In one aspect of the invention, a cavity plate means is removably positioned between first and second mold plates with the cavity plate flush against the first mold plate, the cavity plate means holding objects spaced from the first mold plate and having openings therethrough in registration with the portions of the objects which are to be encapsulated. Fluid plastic is forced through feed runners formed in the first mold plate and outwardly from the mold plate and into the openings of the cavity plate means to encapsulate the portions of the objects held thereby.

Another aspect of the invention is that the objects can be pre-mounted on the cavity plate means prior to positioning of the cavity plate means between the mold plates.

A further aspect of the invention is that the lower mold plate is completely flat and the cavity plate means is positioned flat thereagainst.

A still further aspect of the invention is that the feed runners in the first mold plate and the openings in the cavity plate means are located to enable the maximum number of objects for a given mold area to be encapsulated at one time.

Yet another aspect of the invention is that ejection pins are needed and used only to remove hardened plastic from the feed runners of the first mold plate when the mold plates are moved apart for removal of the cavity plate means therefrom.

Other aspects of the invention will be apparent in the course of the following detailed description.

BRIEF DESCRIPTION OF DRAWINGS

In the drawings, forming a part of this application, and in which like parts are designated by like reference numerals throughout the same, FIG. 1 illustrates a typical lead frame strip having portions thereof to be encapsulated;

FIGS. 2 and 3 are top and side views of the lead frame strip of FIG. 1 after the desired portions thereof have been encapsulated in plastic;

FIG. 9 is a sectional view, in elevation, of a modified embodiment of the present invention.

DESCRIPTION OF THE PREFERRED EMBODIMENTS

Figure 4:
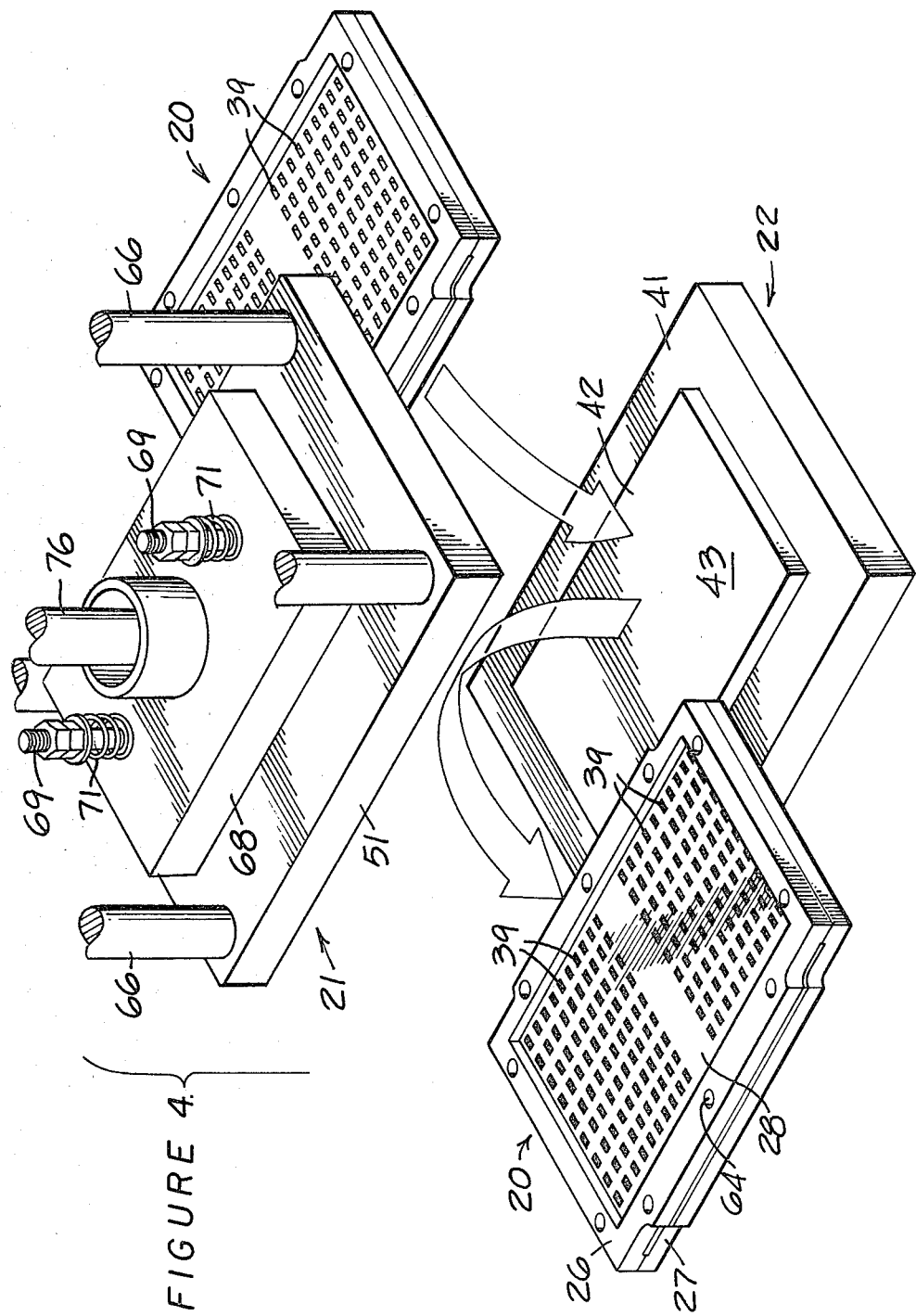
FIG. 4 illustrates in perspective the basic components of the mold of the present invention and their cooperation in use.

Although it has broader utility, the present invention may best be described with relation to its use with a specific object having portions thereof to be encapsulated, namely with reference to a typical lead frame strip 10 as illustrated in FIG. 1.

Such strip 10 is cut, stamped or formed in any conventional manner from a flat sheet of suitable conductive material, to have a plurality of consecutive and identical lead frames LF1–LF5 along its length. Although only five lead frames are illustrated, there may be as many as desired. The strip 10 has end bars 11 and 12 and a plurality of cross bars 13 spaced along the strip, each cross bar 13 having an integral support pad 14 thereon for supporting a suitable semiconductor chip (not shown). Each lead frame also includes cross bars 16 and 17 which support longitudinally extending leads 18 with their ends spaced closely adjacent to pad 14. In manufacture of the devices, a semiconductor chip will be mounted on each of the pads 14 and appropriate electrical connections will be made from the ends of the leads 18 to the chips in a conventional manner.

Following this, portions of the strip, i.e. the portion between the end and cross bars of each lead frame, are encapsulated in plastic to embed the semiconductor chips and lead connections thereto. Whether by use of prior art molds or the mold of the present invention, the strip 10 will appear substantially as shown in FIGS. 2 and 3 after the molding process, i.e., with the desired portions thereof encapsulated in a plastic body 19 which extends outwardly from both sides of the plane of the strip 10.

After molding, the strip is severed midway between the plastic bodies 19, the end bars 11 and 12 are removed, and the cross bars 16 and 17 are severed between the leads 18 to electrically isolate the leads from each other.

Turning now to the mold of the present invention, the basic components thereof are shown in general in FIG. 4 and in more detail in FIGS. 5–8. In general, the mold comprises a cavity plate assembly 20 on which a plurality of lead frame strips 10 are mounted, the assembly 20 being inserted between the upper and lower mold members 21 and 22 and then being removable therefrom after the encapsulation process.

Cavity plate assembly 20 comprises two open, rectangular rack frames 26 and 27 which support cavity plates 28 and 29 with their inner planar surfaces 31 and 32, respectively facing each other and with their outer planar surfaces 33 and 34, respectively, facing away from each other. The cavity plate 29 is provided with a plurality of index pins 36 projecting therefrom for engagement with suitable of the index holes along one of the end bars of strip 10 so that the strips may be positioned thereon. Two index pins may be used for an individual strip of ten lead frames. Preferably the index pins 36 will project from cavity plate 29 sufficiently far to enter registering index holes in the cavity plate 28 so that the cavity plates are held against relative lateral movement when the strips 10 are mounted therebetween. Cavity plate 29 has a plurality of openings 38 therethrough from its inner to outer surfaces, there being an opening 38 for each of the lead frame portions to be encapsulated, each opening 38 being in registration with one of such portions when the lead frame strips are mounted thereon. Cavity plate 28 likewise has a plurality of openings 39 therethrough from its inner to outer surfaces, there being an opening 39 for and in registration with each of the openings 38 of cavity plate 29 when the cavity plates are indexed together. Thus, when the cavity plates are assembled together with lead strips flush against the inner surface of the cavity plates, each set of openings 38 and 39 will form a complete cavity which extends outwardly from both sides of the lead frame strip 10.

The lower mold member 22 comprises a mold base 41 having a lower mold plate 42 fixed thereto, mold plate 42 preferably having a planar surface 43 devoid of surface irregularities, mold plate 42 having a length, width and thickness such that the lower rack frame 27 may fit therearound with the outer planar surface 34 of cavity plate 29 flush against the flat planar surface 43 of mold plate 42. Index stubs 44 project upwardly from mold base 41 and fit into index holes 46 on the rack frame member 27 for lateral registration of the rack frame on the bottom mold member.

The upper mold member 21 includes an upper mold base 51 having an upper mold plate 52 fixed thereto, mold plate 52 having a downwardly facing planar mold surface 53 thereon. Mold plate 52 also has a length, width and thickness such that the upper rack frame member 26 may fit therearound with the outer surface 32 of cavity plate 28 flush against the mold surface 53 of mold plate 52.

Figure 6:
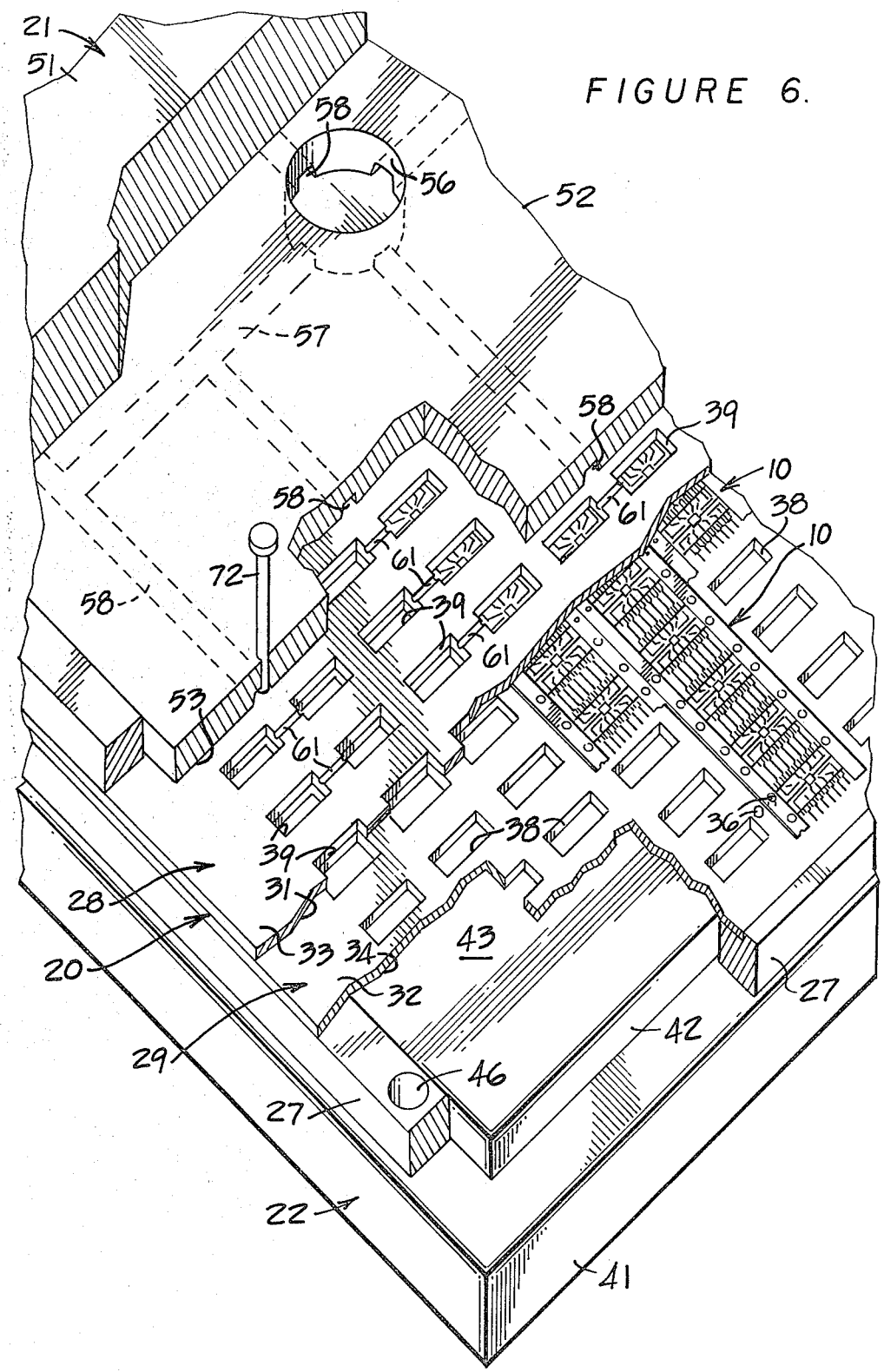
FIG. 6 is a perspective and progressively broken away view of the mold members and cavity plate assembly of FIG. 5.
Figure 7:
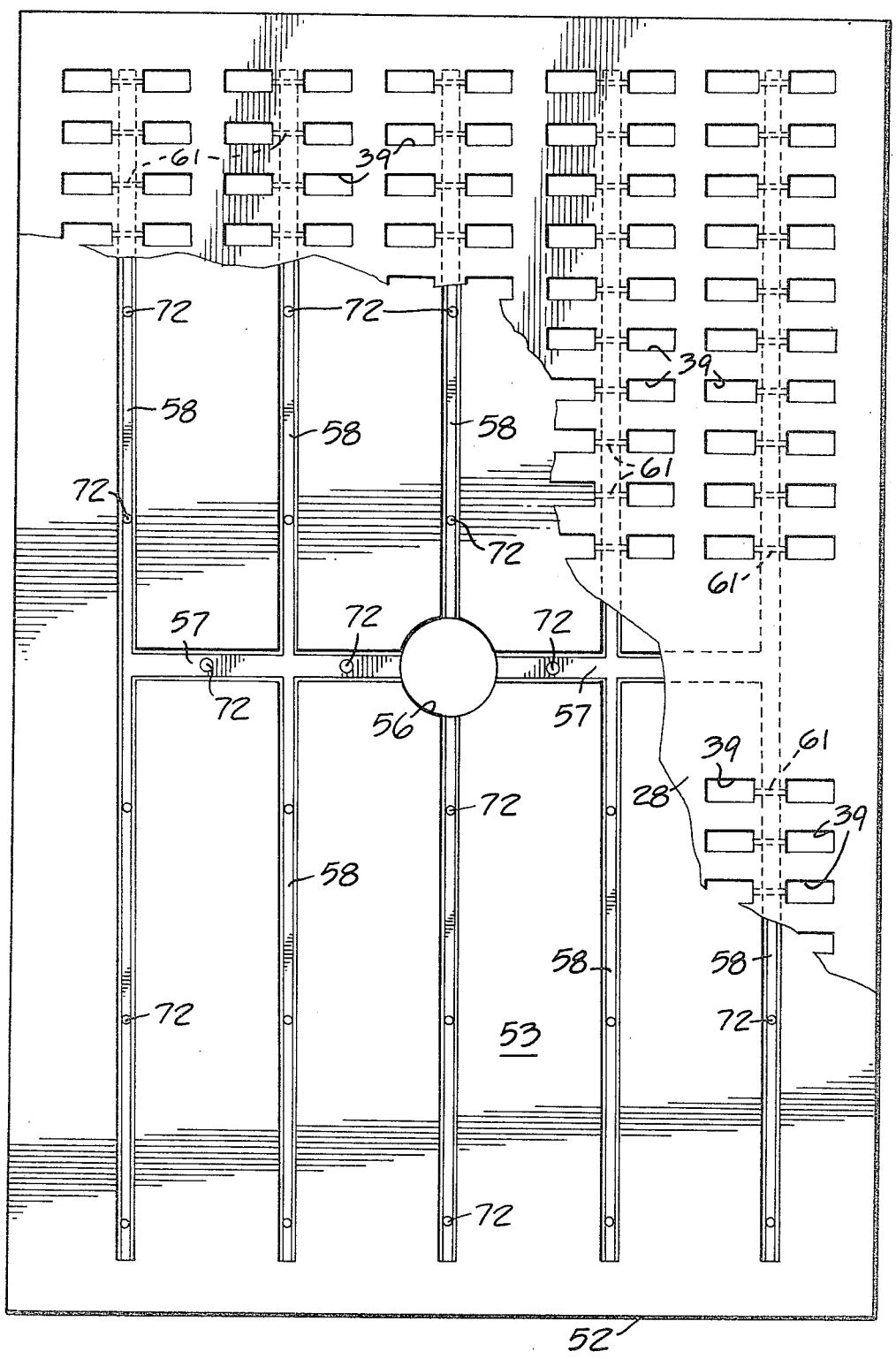
FIG. 7 is a view of the bottom surface of the upper mold plate with a broken away portion of the rack positioned thereagainst to illustrate the arrangement of the mold plate runners and cavity plate openings.

An injection opening 56 is formed through the upper mold member 21 to the planar surface 53 of mold plate 52 and communicates with the feed runner system formed into surface 53, as best illustrated in FIG. 6. The particular cavity plate 28 shown in FIG. 6 has 200 openings 28 for simultaneous incapsulation of a like number of portions of strips 10 (e.g. twenty separate strips each with ten lead frames), with the openings arranged in pairs of spaced-apart parallel rows. For example, the two rows of openings 39 which are furthest to the right and which extend from top to bottom of the drawing would constitute a pair of parallel rows of openings. The next two rows to the left would constitute another pair of rows, and so forth. If desired, one may consider the two rows which are furthest to the right and which extend half-way down the drawing as a pair of rows, while the furthest right openings which extend from the half-way point to the bottom of the drawing may be considered as another pair of parallel rows of openings.

In any event, the upper mold surface 53 has formed thereinto cross feed runners 57 and lengthwise feed runners 58 all in communication with each other and the injection opening 56, there being a feed runner 58 for each pair of rows of openings 39, which feed runner extends between and parallel to the rows of openings. As will be noted in FIGS. 6 and 7, a shallow groove 61 is formed into the upwardly facing outer surface 33 of upper cavity plate 28 from each opening 39 in a row towards the centerline of the pair of rows. Thus, when the upper cavity plate 28 is flush against the upper mold plate 52 and held in indexed relation thereto, a feed runner 58 in mold plate 52 will open downwardly into all of the grooves 61 from the openings in the pair of rows with which the feed runner is associated. Grooves 61 in the cavity plate 28 thus function as gate runners from feed runner 58 to the cavity plate openings.

For ease of manufacture, grooves 61 extend from each opening 39 in a row to the corresponding opening 39 in the other row of the pair of rows. However, it is not necessary to form them all the way across, since it is only necessary to extend them from the openings 39 a sufficient distance as to enable them to open upwardly to the feed runner 58 with which they are associated.

The width of feed runner 58, at the surface 53 of mold plate is related to the spacing between the openings 39 in the pair of rows with which it is associated so that the feed runner 58 will not open downwardly directly into the openings but will instead open downwardly and outwardly into the ends of the openings by way of the gate runner grooves. As brought out hereinafter, this arrangement will provide for an umblemished top surface of the hardened plastic bodies 19 formed in the cavity plate openings. If the feed runner 58 is centered exactly between the rows of openings, when the mold is closed, it can have a width approximately, but no greater than, the spacing between the rows. To reduce tolerance requirements, the width of the feed runner 58 is preferably made so that it is substantially less than the spacing between rows, so that the feed runner can be somewhat off-center to the rows and still communicate with the cavity plate openings only by way of the lateral grooves 61. The minimum width of the feed runners is, of course, limited by the need to provide sufficient flow capacity in the feed runners for molding. The side walls of the feed runners 57 and 58 slope upwardly towards each other so that hardened plastic therein may be easily ejected therefrom.

Figure 5:
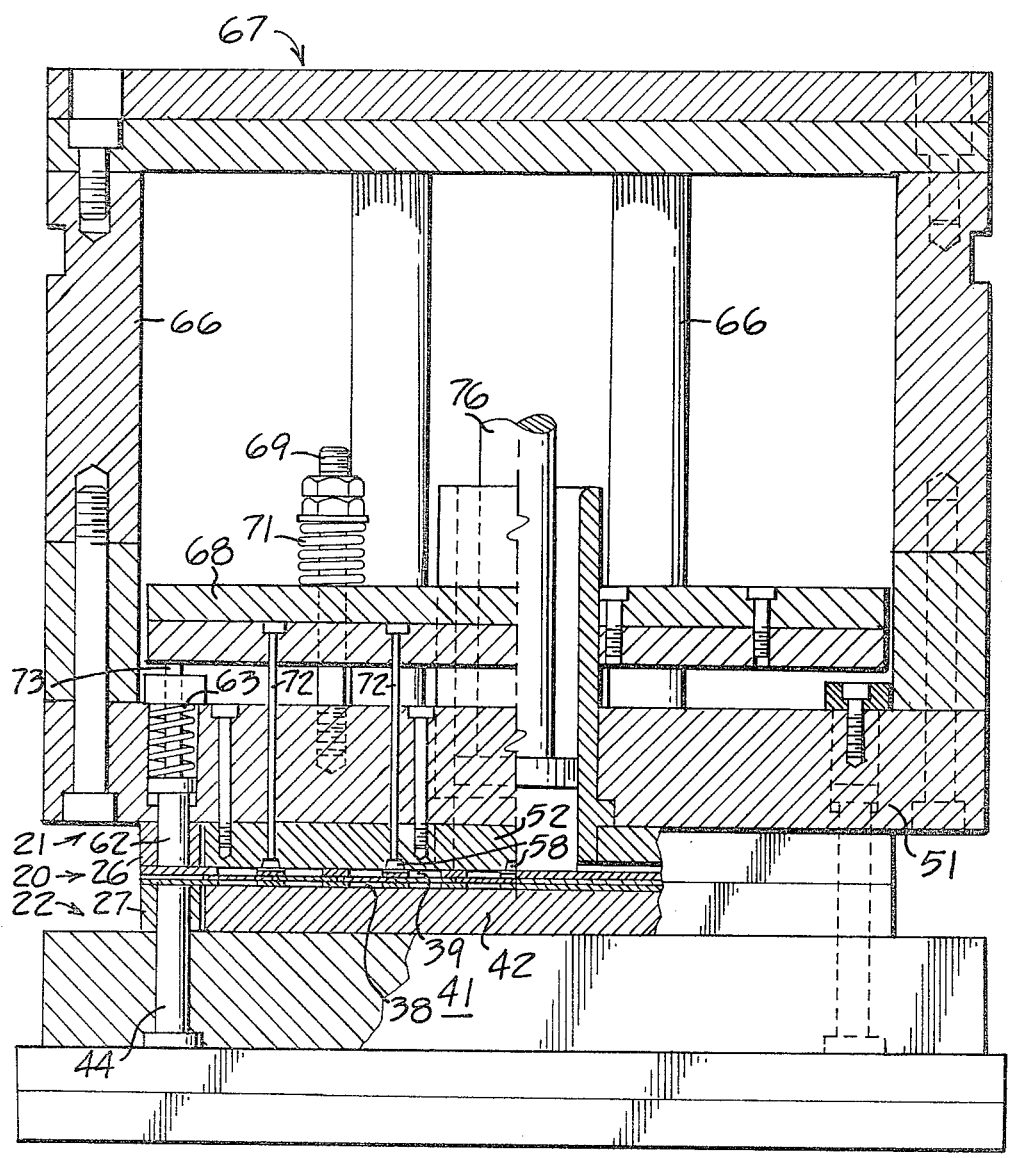
FIG. 5 is a sectional view, in elevation, of the mold of FIG. 4.

As shown in FIG. 5, the upper mold base 51 is provided with index stubs 62, downwardly biased by springs 63, which project downwardly from the mold base 51 for entry into index holes 64 (FIG. 4) in the upper rack frame 26 to secure the cavity plate assembly against lateral shifting relative to the mold plate 52. The upper mold base 51 is fixed to columns 66 of a vertically reciprocal frame 67 for movement towards and away from the lower mold member by conventional means not shown.

The ejection means comprises an ejection pin retaining plate 68 mounted on bolts 69 for vertical movement relative to the upper mold member and biased downwardly by springs 71, plate 68 having a plurality of ejection pins 72 thereon which extend downwardly through the upper mold base 51 and upper mold plate 52 and into feed runners 57 and 58 at appropriate points along those runners. Suitable retainer pin lifting means are provided to lift plate 68 when the mold is closed so that the pins are withdrawn from the feed runners. As for example, selected of index pins 62 may have an upward extension 73 which engages plate 68. Thus, when the mold is closed, index stub 62 will bear against the upper cavity plate 28 of rack 20 so that index stub 62 is moved upwardly relative to the upper mold member and so that its extension 73 holds ejection pin plate 68 above the upper mold member sufficiently to retract ejection pins 72 from the feed runners. When the mold frame 66 is subsequently moved upwardly, springs 63 and 71 will move index stubs 62 and ejection pins 72 downwardly relative to the upper mold so that the ejection pins 72 move into the feed runners 67 and 68.

OPERATION

After the lead frame strips 10 have had the semiconductor chips mounted on the pads 14 thereof and the electrical connections have been made between the leads and the chips, strips 10 with ten lead frame each are mounted on the lower cavity plate 29. After the lower cavity plate is completely loaded, upper cavity plate 28 is mated therewith and the cavity plates are mounted in the rack frames 26 and 27.

With the upper mold member 21 vertically elevated, the loaded cavity frame assembly 20 is positioned on the lower mold member 22 with the bottom outer planar surface 34 of lower cavity plate 29 in flush contacting engagement with planar surface 43 of mold plate 42. The upper mold member 21 is then lowered so that the planar surface 53 of upper mold plate 52 comes into flush contacting engagement with the upper outer planar surface 32 of upper cavity plate 28.

A measured amount of suitable liquified plastic material is placed into injection opening 56. Plunger 76 is then forced downwardly to force the plastic to flow through the feed runners 57 and 58 in the upper plate 51 and above the upper surface of cavity plate 28 and then downwardly and outwardly through all of the gate openings 61 to fill all of the cavities formed by the registered openings 38 and 39 of the cavity plates. The inner surfaces 31 and 33 of the cavity plates adjacent each of the cavity plate openings are flush against end bars 11 and 12 and cross bars 16 and 17 of the lead frame strip 10 so that plastic flow laterally between the cavity plates is prevented.

The plastic material filling the feed runners and cavity plate openings will then polymerize at the elevated temperature of the mold members created by conventional heaters (not shown) which are disposed in the mold members.

After the plastic has hardened, the upper mold member is raised, causing the ejection pins 72 to bear downwardly on the hardened plastic in the runners 58 and 59 so that the plastic runners are ejected therefrom.

Figure 8:
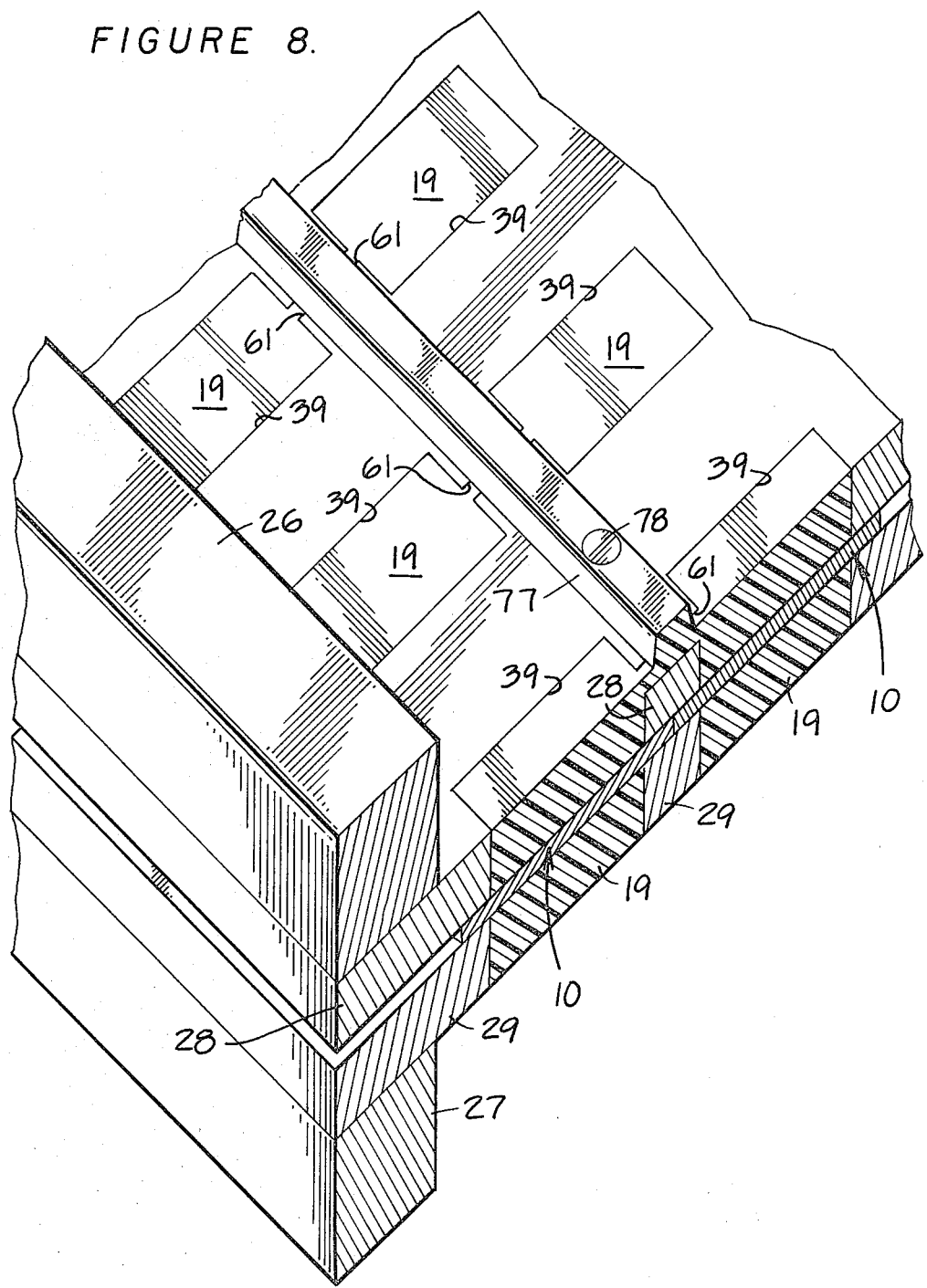
FIG. 8 is a perspective view of a portion of the cavity plate assembly after removal from the mold plates.

With the upper mold member raised, cavity plate assembly 20 is removed from the lower mold member and set aside for cooling. FIG. 8 illustrates such removed cavity plate assembly, with the plastic bodies 19 filling the cavity plate openings, and with the plastic runner portion 77 which had filled the feed runner leading to the cavity plate openings, the plastic runner being attached to the ends of the plastic bodies 19 by the plastic in grooves 61. As is seen in FIG. 8, runner portion 77 has a circular deformation 78 on the upper surface thereof where it was engaged by an ejection pin 72. No such deformation is present on the upper surface of bodies 18, since no ejection pins are required to separate the upper surface of the bodies 18 from the smooth surface of upper mold plate 52 which formed such upper body surfaces.

With the cavity plate assembly 20 removed, mold plates 42 and 52 are then cleaned for the next molding operation. Since the mold surface 43 of lower mold plate 42 is completely flat, it may be very easily and rapidly wiped off and cleaned. Mold surface 53 of the upper mold plate 52 is likewise easily cleaned since the only surface irregularities are the relatively few elongated feed runners 57 and 58 formed thereinto.

After such cleaning, the mold members 21 and 22 are ready for another loaded cavity plate assembly 20 to be inserted for the next molding operation.

When the plastic in the first removed cavity plate assembly has cooled sufficiently, the runner 77 is broken away from the ends of the plastic bodies 19, the cavity plates 26 and 27 are separated and the lead frame strips 10 with the molded encapsulated bodies 19 thereon are removed. The removed strip is now as shown in FIGS. 2 and 3. The upper and lower surface of the bodies 19 are completely unblemished since they have been formed by the flat surfaces of the upper and lower mold plates in registration with the cavity plate openings. The only rough spot thereon is at the end thereof where the broken away feed runner 77 had been joined thereto.

The cavity plates 28 and 29 are then cleaned in preparation for the next use thereof. Since the detached cavity plates are relatively small, they may be easily cleaned in a conventional ultrasonic bath.

As may be seen from the foregoing, the present invention has a number of advantages. The initial equipment cost is reduced since the lower mold surface 43 is completey flat and the upper mold surface 53 has only the feed channels 57 and 58 machined thereinto. The cavity plates 28 and 29 are relatively inexpensive to make since the openings 38 and 39 go completely therethrough, thus enabling the openings to be formed by a stamping or punching operation, rather than having bottomed cavities milled thereinto. Furthermore, since the upper and lower mold members 42 and 52 have smooth molding surfaces, save for the feed runners in the upper mold members, the likelihood of damage and need for replacement of these mold members is greatly reduced. Replacement is limited essentially to the racks 20, and shipping costs for repaired or new cavity plates is considerably less than if the upper or lower mold members 42 or 52 were involved.

The present invention also enables a maximum number of components to be encapsulated for a given mold area. For the particular illustrated lead frame strips 10, the spacing of the openings in the cavity plates along the length of the strip is dictated by the dimensions of the strip itself, i.e. the spacing between the chip pads. In conventional molds, wherein mold cavities are formed into the upper and lower mold plates, the spacing cavities along any row is also dictated by the spacing between the chip pads, but there must be enough spacing between strips to perovide room for a feed runner to extend along and between the strips, with gate runners then extending laterally from the feed runners to the cavities. In the present invention wherein the feed runner 58 is formed in the mold plate 52 and plastic is injected into the cavity plate openings through an opening between the mold plate 52 and the upper surface of cavity plate 28, while the strip 10 is held against the lower surface of cavity plate 28, the strips 10 may be mounted in cavity plate assembly 20 side by side to each other, as shown in FIG. 6, so that the spacing between adjacent rows of openings is the minimum, namely about twice the width of one of the end bars 11 or 12 of the strip 10. As a consequence, the area of the cavity plate which is as equal to the areas of the upper and lower mold plates may be almost entirely covered with strips 10. For a given mold plate area, approximately twice as many strips 10 can be accommodated and operated upon at one time by the present invention as compared with prior art molds.

The feed runners 58, which extend along and between the pairs of openings can be made as small as necessary for flow purposes and thus will provide for minimum wastage. Since the strips 10 can be mounted side by side, the distance from the feed runners 58 to the cavity plate openings is very small and the amount of wastage in grooves 61 will be very greatly reduced from that which is wasted in the gate runners of conventional molds.

Costs of operation are also substantially reduced by the decrease in down time per cycle of operation, thereby allowing more molding cycles to be carried out per day. As brought out above, the amount of down time is decreased by the ease of cleaning of the mold plates and by the extended life of the mold plates. Additionally, when more than one cavity plate assembly is used, a molding operation can be carried out with one cavity plate assembly while a previously used and removed assembly is cleaned and reloaded for reuse.

The initial cost, and maintenance, of the mold is also substantially reduced by the fact that no ejection pins are needed for engagement with the molded plastic bodies 19, whereas two for each body 19 are needed in present molds. Thus, for a 200 cavity mold, 400 ejection pins are eliminated. In addition, the elimination of ejection pins to eject the molded housings eliminates the ejection pin deformation thereof, i.e., as shown at 78 on FIG. 8, thus improving the appearance of the finished product and allowing a greater unblemished surface for addition of markings thereon.

The present invention also enables the plastic bodies 19 to be easily marked during molding, if such is desired. In present molds, wherein bottomed cavities are formed in the mold surfaces, the bottom of each mold cavity would have to be separately engraved or embossed to form a marking on the housing molded therein. Once the mold cavity surfaces are so prepared, it is extremely dificult to provide for a change in marking.

In the present invention, a flat sheet can be prepared, with suitable markings engraved or embossed thereon, such markings being spaced apart for registration with the cavity plate openings. Such sheet can then simply be laid down on the bottom mold plate 42 so that the upper surface of the sheet becomes the bottom mold surface 43. When desired, such sheet can be removed so that the housings 19 will again be unmarked, or a different sheet with different markings can be substituted.

FIG. 9 illustrates two modifications of the present invention.

In the first modification, the cavity plate 28' differs from the previously described upper cavity plate 28 in that the upper surface thereof does not have any gate runner grooves 61 formed thereinto. The upper mold plate 52' differs from before in that the width of feed runners 58', at the mold surface of the mold plate, is made slightly greater than the spacing between the openings 39' of the rows with which the feed runner is associated so that the feed runner opens downwardly directly into each of the openings 39' through a restricted access gate opening 61' between the end of the opening 39' and the side of feed runner 58'.

This manner of injecting plastic into the openings 39' by flowing the plastic through the mold plate feed runner and then outwardly from the mold plate into the cavity plate openings has the advantage over the previously described form in that the grooves 61 in the cavity plate are eliminated, thus decreasing the cost of manufacture of the cavity plates. However, it does have the disadvantage in that, after hardening, the runner 77 is attached to the plastic bodies 19 at each upper surface thereof, rather than to the ends of bodies 19 as previously described. As a consequence, when the runner 77 is broken off, the upper surface of the bodies 19 will have a small blemish thereon.

In the second modification illustrated in FIG. 9, cavity plate assembly 20' differs from the previously described assembly 20 in that only an upper cavity plate is used, in the cavity plate assembly, such upper cavity plate 28' however, having the openings 39' therethrough spaced apart from each other in the same manner as before. The lower mold plate 42' differs from before in that its mold surface 43' has formed downwardly thereinto cavities 38', one for each portion of strips 10 which are to be encapsulated.

In this embodiment, strips 10 are positioned on mold plate 42' by suitable index pins (not shown) which function for the same purpose as previously described index pins 36. Alternatively, such index pins could be fixed to the lower surface of cavity plate 28 (now one of the outer surfaces of rack 20') to secure strips 10 thereto, provided the index pins have a sufficiently tight fit in the index holes of the strips to retain the strips in place on the lower cavity plate surface. In either event, the cavity plate assembly 20' is positioned on the lower mold plate 42' after the strips have been mounted. Openings 39 of cavity plate 28 and cavities 38' of the lower mold plate 42' will then be in registration to form a complete cavity for each portion to be encapsulated.

The molding process is the same as before. Liquified plastic is forced through feed runners 58' into each cavity of the pair of rows with which each feed runner is associated. After hardening, the plastic has hardened, the upper mold member is elevated and the plastic ejected from runners 58 by ejection pins 72 as previously described. Cavity plate assembly 20' is pried upwardly to remove the lower halves of the plastic bodies 19 from cavities 38' of the lower mold plate 42' and the cavity plate assembly rack is removed.

The upper mold plate 52 is cleaned as before, cavities 38' of the lower mold plate 42' are cleaned and the mold is ready for the next batch.

The second modification is not as advantageous as before in that the lower mold plate 42', with cavities 38' formed thereinto, is more expensive to machine, as compared to the manufacture of the lower cavity plate 29, and it is harder to clean. The down time is increased if the strips 10 are mounted directly on the lower mold plate 42' rather than being preloaded onto a cavity plate assembly.

However, this modification of FIG. 9 does have the previously described advantages associated with the cooperation between the upper mold plate 52 and upper cavity plate 28, namely the minimal spacing between strips 10, the elimination of gate runners, ease of cleaning of the upper mold plate 52, elimination of ejection pins for the individual bodies 19, and so forth.

Either of the two modifications of FIG. 9 can be used alone in a modification of the apparatus shown in FIGS. 4–8. For example, the two cavity plate arrangement of FIGS. 4–8 could be modified as in FIG. 9 to provide for injection of plastic directly downwardly into the cavity plate openings. Likewise, the mold of FIGS. 4–8 could be modified to use the single cavity plate assembly and cavitied lower mold plate arrangement of FIG. 9 while using the plastic distribution system of FIGS. 4–8 wherein plastic is injected from feed runners 58 into the ends of the cavity plate openings by way of the grooves 61.

What is claimed is:

1. Apparatus for encapsulating objects carried by a lead frame strip, said apparatus comprising:
   first and second mold bases,
   first and second opposed mold plates, said first mold plate being fixed to said first mold base and said second mold plate being fixed to said second mold base, said first and second opposed mold plates each having a generally planar mold surface thereon,
   cavity plate means removably positionable between said first and second mold plates for holding a lead frame and said objects carried thereby in position relative to said mold plates and with said lead frame and objects all being completely spaced away from said first mold plate when said cavity plate means is positioned between said mold plates and flush against said mold surface of said first mold plate, said cavity plate means having spaced apart and generally planar outer surfaces, one of which is spaced away from the lead frame strip held by said cavity plate means and flush with the mold surface of said first mold plate and the other of which faces towards said mold surface of said second mold plate when said cavity plate means is positioned between said mold plates and said lead frame strip is held by said cavity plate means, said cavity plate means having openings therethrough from one outer surface thereof to the other surface thereof, said openings being in registration with said objects carried by said lead frame strip and held by said cavity plate means,
   means forming an injection opening through said first mold plate to the mold surface thereof,
   means for injecting fluid plastic through said injection opening to the mold surface of said first mold plate,
   feed runner means formed into said mold surface of said first mold plate and gate means formed solely by and between said first mold plate and said cavity plate means for fluidly communicating said injection opening with all of said openings of said cavity plate means when said one outer surface of said cavity plate means is positioned against said mold surface of said first mold plate.

2. Apparatus as set forth in claim 1 wherein said cavity plate means has a plurality of spaced-apart rows of said openings therethrough, wherein said feed runner means includes a feed runner associated with each of said pairs of rows when said cavity plate means is positioned flush against said first mold plate, each feed runner extending between and parallel to the rows with which it is associated and having a width no greater than the spacing between said rows, and wherein said cavity plate means includes a gate runner groove formed into said one surface of said cavity plate means from each of said openings, which groove is in fluid communication with the feed runner associated with the opening when said cavity plate means is positioned against said first mold plate.

3. Apparatus as set forth in claim 2 wherein the width of each feed runner is substantially less than the spacing between the rows with which the feed runner is associated.

4. Apparatus as set forth in claim 1 wherein said cavity plate means has a pair of spaced-apart rows of said openings therethrough, and wherein said feed runner means includes a feed runner formed into the mold surface of said first mold plate which feed runner extends between and parallel to said rows of openings and has a width slightly greater than the spacing between said rows to provide communication from said feed runner directly into the openings of said cavity plate means when said cavity plate means is positioned flush against said first mold plate.

5. Apparatus as set forth in claim 4 wherein the portions of said mold surface of said first mold plate adjacent said feed runner and covering said cavity plate means are uninterruptedly flat.

6. Apparatus as set forth in claim 1 wherein said cavity plate means has a plurality of pairs of spaced-apart rows of said openings therethrough, and wherein said feed runner means includes a feed runner associated with each of said pairs of rows when said cavity plate means is positioned flush against said first mold plate, each feed runner extending between and parallel to the rows with which it is associated and having a width slightly greater than the spacing between the rows to provide communication from said feed runner directly into the openings in said rows.

7. Apparatus as set forth in claim 6 wherein said mold surface of said first mold plate is uninterruptedly flat other than for said injection opening and said feed runner means formed thereinto.

8. Apparatus as set forth in claim 7 and further including ejection pin means extending through said first mold plate and only into said feed runner means.

9. Apparatus as set forth in claim 1 wherein said cavity plate means has a pair of spaced-apart rows of said openings therethrough, wherein said feed runner means includes a feed runner formed into said mold surface of said first mold plate which feed runner extends between and parallel to said rows of openings and has a width no greater than the spacing between said rows, and wherein said cavity plate means includes a gate runner groove formed into said one outer surface of said cavity plate means from each of said openings which is in fluid communication with said feed runner when said cavity plate means is positioned flush against said first mold plate.

10. Apparatus as set forth in claim 9 wherein the width of said feed runner is substantially less than said spacing between said rows of openings.

11. Apparatus as set forth in claim 9 wherein the portions of said mold surface of said first mold plate adjacent said feed runner and covering said cavity plate means are uninterruptedly flat.

12. Apparatus as set forth in claim 11 and further including ejection pin means extending through said first mold plate and only into said feed runner means.

13. Apparatus as set forth in claim 1, wherein said cavity plate means has the further function of holding at least one lead frame strip between said other outer surface of said cavity plate means and the mold surface of said second mold plate when said cavity plate means is positioned between said first and second mold plates, and wherein said planar mold surface of said second mold plate has a cavity formed thereinto for and in registration with each opening through said cavity plate means.

14. Apparatus as set forth in claim 13 wherein said cavity plate means has a pair of spaced-apart rows of said openings therethrough, wherein said feed runner means includes a feed runner formed into said mold surface of said first mold plate which feed runner extends between and parallel to said rows of openings and has a width no greater than the spacing between said rows, and wherein said cavity plate means includes a gate runner groove formed into said one surface of said cavity plate means from each of said openings which groove is in fluid communication with said feed runner when said cavity plate means is positioned flush against said first mold plate.

15. Apparatus as set forth in claim 14 and further including ejection pin means extending through said first mold plate and only into said feed runner means.

16. Apparatus as set forth in claim 13 wherein said cavity plate means has a pair of spaced-apart rows of said openings therethrough, and wherein said feed runner means includes a feed runner formed into the mold surface of said first mold plate which extends between and parallel to said rows of openings which has a width slightly greater than the spacing between said rows to provide communication from said feed runner to the openings of said cavity plate means when said cavity plate means is positioned flush against said first mold plate.

17. Apparatus as set forth in claim 16 and further including ejection pin means extending through said first mold plate and only into said feed runner means.

18. Apparatus as set forth in claim 1, wherein said cavity plate means includes first and second cavity plates each having planar inner and outer surfaces, said cavity plates being matable with the inner surfaces thereof facing each other, each cavity plate having openings therethrough, the openings of one cavity plate being in registration with the openings of the other cavity plate to form the openings through said cavity plate means when said cavity plates are mated together.

19. Apparatus as set forth in claim 18, wherein said cavity plate means includes means for holding at least one lead frame strip in engagement with and between the inner surfaces of said first and second cavity plates and with said objects to be encapsulated being in registration with said cavity plate openings, and wherein said mold surface of said second mold plate is uninterruptedly flat.

20. Apparatus as set forth in claim 19 wherein said cavity plate means has a plurality of spaced-apart rows of said openings therethrough, wherein said feed runner means includes a feed runner associated with each of said pairs of rows when said cavity plate means is positioned against said first mold plate, each feed runner extending between and parallel to the rows with which it is associated and having a width no greater than the spacing between said rows, and wherein said cavity plate means includes a gate runner groove formed into said one surface of said cavity plate means from each of said openings which groove is in fluid communication with the feed runner associated with the opening when said cavity plate means is positioned flush against said first mold plate.

21. Apparatus as set forth in claim 20 wherein the width of each feed runner is substantially less than the spacing between the rows with which the feed runner is associated.

22. Apparatus as set forth in claim 19 wherein said cavity plate means has a plurality of pairs of speced-apart rows of said openings therethrough, and wherein said feed runner means includes a feed runner associated with each of said pairs of rows when said cavity plate means is positioned flush against said first mold plate, each feed runner extending between and parallel to the rows with which it is associated and having a width slightly greater than the spacing between the rows to provide communication from said feed runner directly into the openings in said rows.

23. Apparatus as set forth in claim 22 wherein said mold surface of said first mold plate is uninterruptedly flat other than for said injection opening and said feed runner means formed thereinto.

24. Apparatus as set forth in claim 19 wherein said cavity plate means has a pair of spaced-apart rows of said openings therethrough, and wherein said feed runner means includes a feed runner formed into the mold surface of said first mold plate which feed runner extends between and parallel to said rows of openings and has a width slightly greater than the spacing between said rows to provide communication from said feed runner to the openings of said cavity plate means when said cavity plate means is positioned flush against said first mold plate.

25. Apparatus as set forth in claim 24 wherein the portions of said mold surface of said first mold plate adjacent said feed runner and covering said cavity plate means are uninterruptedly flat.

26. Apparatus as set forth in claim 25 and further including ejection pin means extending through said first mold plate and only into said feed runner means.

27. Apparatus as set forth in claim 19 wherein said cavity plate means has a pair of spaced-apart rows of said openings therethrough, wherein said feed runner means includes a feed runner formed into said mold surface of said first mold plate which feed runner extends between and parallel to said rows of openings and has a width no greater than the spacing between said rows, and wherein said cavity plate means includes a gate runner groove formed into said one surface of said cavity plate means from each of said openings which groove is in fluid communication with said feed runner when said cavity plate means is positioned flush against said first mold plate.

28. Apparatus as set forth in claim 27 wherein the width of said feed runner is substantially less than said spacing between said rows of openings.

29. Apparatus as set forth in claim 27 wherein the portions of said mold surface of said first mold plate adjacent said feed runner and covering said cavity means are uninterruptedly flat.

30. Apparatus as set forth in claim 29 and further including ejection pin means extending through said first mold plate and only into said feed runner means.

* * * * *